United States Patent [19]
Kato

[11] Patent Number: 5,587,275
[45] Date of Patent: Dec. 24, 1996

[54] PHOTOSENSITIVE RESIN COMPOSITION AND A PROCESS FOR FORMING A PATTERNED POLYIMIDE FILM USING THE SAME

[75] Inventor: Hideto Kato, Matsuida, Japan

[73] Assignee: Shin-Etsu Chemical Co., Ltd., Tokyo, Japan

[21] Appl. No.: 498,225

[22] Filed: Jul. 5, 1995

[51] Int. Cl.$^6$ .................................................. G03F 7/038
[52] U.S. Cl. .................... 430/283.1; 522/99; 522/149; 430/325
[58] Field of Search ........................... 430/283, 325; 522/148, 164, 99, 149

[56] References Cited

U.S. PATENT DOCUMENTS

| | | | |
|---|---|---|---|
| 4,332,882 | 6/1982 | Ahne et al. | 430/322 |
| 4,673,773 | 6/1987 | Nakano et al. | 430/283 |

FOREIGN PATENT DOCUMENTS

| | | | |
|---|---|---|---|
| 3-186847A | 8/1991 | Japan | 430/283 |

*Primary Examiner*—Cynthia Hamilton
*Attorney, Agent, or Firm*—Cushman Darby & Cushman IP Group; Pillsbury Madison & Sutro LLP

[57] ABSTRACT

The composition comprises (A) a specified polyimide precursor and (B) at least one member selected from the group consisting of a sensitizer, a photopolymerization initiator and a combination thereof. The above method comprises coating the solution of the above photosensitive resin composition on a substrate, followed by drying to form a coating film; exposing the coating film to light, followed by developing with an aqueous alkaline solution to form a patterned film; and heat-curing the patterned film. The composition has little ionic impurities mixed therein during the preparation of the composition; is excellent in storage stability in the state of a solution; can be developed with an aqueous alkaline solution, which does not cause the problems such as a problem to health and a problem to the treatment of waste liquids, within a short time; and exhibits a good sensitivity even when formed a thick film, thereby readily providing a patterned resinous film.

Further, the cured product obtained by heat-curing the patterned film has a superior heat resistance and excellent electrical and mechanical properties, which can be suitably used as a protective film for use in electronic parts.

11 Claims, No Drawings

PHOTOSENSITIVE RESIN COMPOSITION AND A PROCESS FOR FORMING A PATTERNED POLYIMIDE FILM USING THE SAME

BACKGROUND OF THE INVENTION

1. Field of the Invention

The present invention relates to a photosensitive resin composition useful for forming protective films such as insulating protective films for use in semiconductor elements, oriented films for use in liquid crystal display elements, and insulating films for use in multi-layered printed circuit boads, and to a process for forming a patterned polyimide film using said composition.

2. Description of the Prior Art

As conventional heat resistant photosensitive materials, there are known, for example, a material comprised of polyamic acid and bichromic acid salt (Japanese Patent Publication (Kokoku) No. 49-7374 corresponding to U.S. Pat. No. 3,623,870, GB 1316976 and CA 918484), a material prepared by introducing a photosensitive group into the carboxyl group of polyamic acid with the aid of an ester bond (Japanese Pre-examination Patent Publication (Kokai) No. 49-115541 and Japanese Pre-examination Patent Publication (Kokai) No. 55-45746, which correspond to U.S. Pat. No. 3,957,512 and GB 1467226), a material comprised of polyamic acid and a amine compound having a photosensitive group (Japanese Pre-examination Patent Publication (Kokai) No. 54-145794 corresponding to U.S. Pat. No. 4,243,743), and a material prepared by introducing a photosensitive group into the carboxyl group of polyamic acid with the aid of an silylester bond (Japanese Pre-examination Patent Publication (Kokai) No. 62-275129).

These photosensitive materials, however, should use, as a liquid developer, an organic solvent when developing. The use of the organic solvent involves the problems such as an affect on the operator's health and the treatment of waste liquids.

In order to solve the above problems, there have been proposed as a photosensitive material capable of developing with an aqueous liquid, for example, a material comprised of a substance prepared by introducing a photosensitive group into the carboxyl group of polyamic acid with the aid of an amide bond (Japanese Pre-examination Patent Publication (Kokai) No. 60-100143 and Japanese Pre-examination Patent Publication (Kokai) No. 2-157845, which correspond to U.S. Pat. No. 4,515,887, U.S. Pat. No. 4,587,204 and GB 2145728), a positive type photosensitive composition prepared by mixing a polyimide resin having a phenol group with naphthoquinonediazidesulfonic acid ester (Polymer Engineering and Science, July 1989, Vol. 29, 954).

These photosensitive materials, however, involve the problems that they require a long time to develop and can not exhibit a sufficient sensitivity especially when formed into a thick film.

SUMMARY OF THE INVENTION

Accordingly, an object of the present invention is to provide a photosensitive resin composition capable of development with an aqueous liquid in a short time, as well as exhibiting a sufficient sensitivity even when formed into a thick film, thereby allowing readily to form a patterned polyimide film; and a process for forming a patterned heat resistant polyimide film using said composition.

The present inventor has earnestly studied in order to accomplish the above object, and as a result, found that when mixing a specified polyimide precursor with a photosensitizer, a negative type photosensitive polyimide resin composition capable of readily development with an aqueous alkaline solution can be obtained, that during the preparation of such a composition, ionic impurities (which cause reliability on various electronic parts using a protective film to lower) are scarcely mixed therein, that the resulting composition exhibits a good sensitivity to irradiation of light so that a pattern can be readily formded, and that upon curing such a composition, a polyimide film excellent in heat resistance and in electrical and mechanical properties is formed. Thus, the present invention has been completed.

The present invention provides a photosensitive resin composition comprising:

(A) a polyimide precursor comprised of a structural unit represented by the following general formula (1):

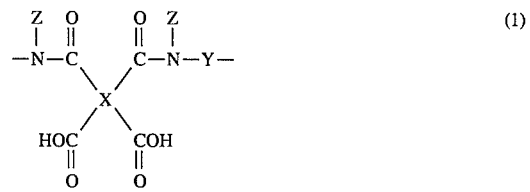

wherein X is a tetravalent organic group having an aromatic ring, Y is a divalent organic group having an aromatic ring or a divalent organic group having a siloxane bond, and the two Z, which may be the same or different, are each a hydrogen atom or a monovalent organic group having an acryloxy group or a methacryloxy group represented by the following general formula (2):

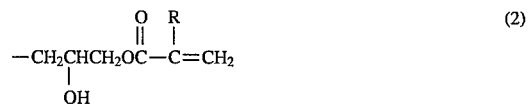

wherein R is a hydrogen atom or a methyl group, provided that the content of the monovalent organic group represented by said general formula (2) is at least 30 mole % of the total Z contained in the polyimide precursor; and (B) one member selected from the group consisting of a sensitizer, a photopolymerization initiator and a combination thereof.

The present invention provides also a process for forming a patterned polyimide film, which comprises the steps of:

coating a solution of said photosensitive resin composition on a substrate and drying the same to form a coating film, exposing the coating film to light and developing the same using, as a liquid developer, an aqueous alkaline solution to form a patterned film, and heat-curing the patterned film.

The photosensitive resin composition of the present invention has little ionic impurities mixed therein during the preparation of the composition; is excellent in storage stability in the state of solution; can be developed with an aqueous alkaline solution, which does not cause the problems such as a problem to health and a problem to the treatment of waste liquids, within a short time; and exhibits a good sensitivity even when formed a thick film, thereby readily providing a patterned resinous film.

Further, by heat-curing the patterned film, a polyimide film having a superior heat resistance and excellent electrical and mechanical properties is obtained, which can be suitably used as a protective film for use in electronic parts.

DETAILED DESCRIPTION OF THE PREFERRED EMBODIMENTS

(A) POLYIMIDE PRECURSOR

The polyimide precursor (A) of the composition according to the present invention is comprised of a structural unit represented by the above general formula (1).

The X in the above general formula (1) is a tetravalent organic group. A plurality of X contained in the polyimide precursor (A) may be the same or different. Typical examples of X, which examples are not to be contrueded as limiting X, are shown below:

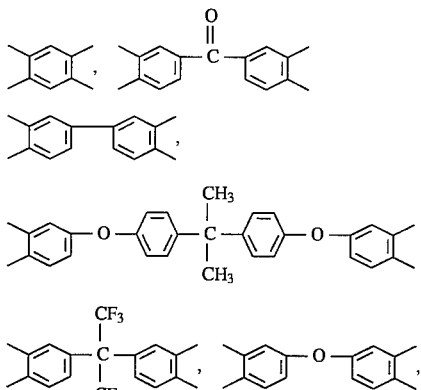

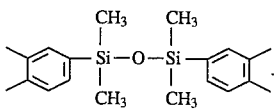

and

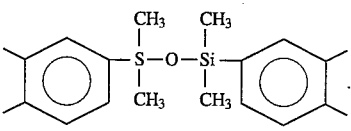

Among these examples of X, preferred are as follows:

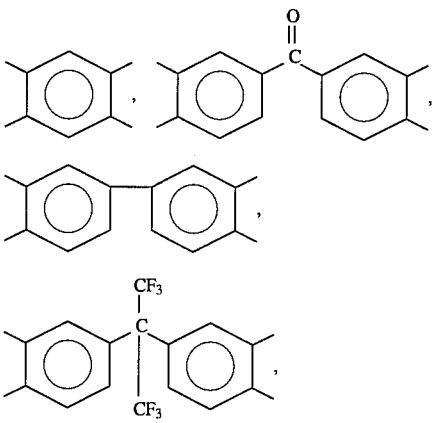

and

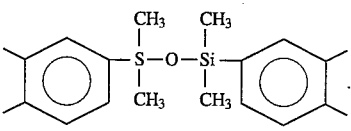

The Y in the above general formula (1) is a divalent organic group having an aromatic ring or a divalent organic group having a siloxane bond. Of course, Y may be a divalent organic group having an aromatic ring and a siloxane bond. The plural Y contained in the polyimide precursor (A) may be the same or different.

Specific examples of Y, the above divalent organic group having an aromatic ring, are shown hereinafter:

a group represented by the following general formula (3):

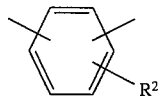 (3)

wherein $R^2$ is —H, —Cl, —CONH$_2$ or an alkyl group having 1 to 3 carbon atoms [for example, —CH$_3$, —CH$_2$CH$_3$, —CH$_2$CH$_2$CH$_3$ and —CH(CH$_3$)$_2$];

a group represented by the following general formula (4):

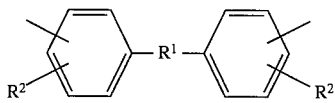 (4)

wherein $R^1$ is single bonding, —O—, —SO$_2$—, —S— or an alkylene group having 1 to 3 carbon atoms [for example, —CH$_2$—, —CH$_2$CH$_2$—, —CH$_2$CH$_2$CH$_2$—, —CH$_2$CH(CH$_3$)—, —C(CH$_3$)$_2$— and —C(CF$_3$)$_2$—], and the plural $R^2$, which may be the same or different, are as defined above;

a group represented by the following general formula (5):

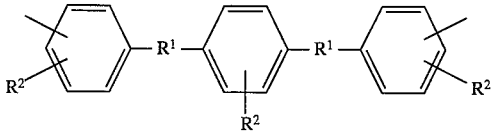 (5)

wherein the plural $R^1$, which may be the same or different, are as defined above, and the plural $R^2$, which may be the same or different, are as defined above;

a group represented by the following general formula (6):

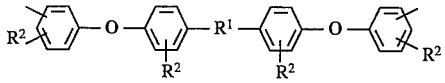 (6)

wherein the plural $R^1$, which may be the same or different, are as defined above, and the plural $R^2$, which may be the same or different, are as defined above;

a group having a siloxane bond represented by the following general formula (7):

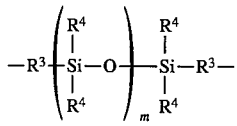 (7)

wherein the plural $R^3$, which may be the same or different, are each an alkylene group having 3 to 4 carbon atoms (for example, —CH$_2$CH$_2$CH$_2$— and —CH$_2$CH$_2$CH$_2$CH$_2$—), a phenylene group or a group represented by the formula:

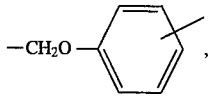

the plural $R^4$, which may be the same or different, are each an alkyl group having 1 to 3 carbon atoms [for example, —CH$_3$ and —CH$_2$CH$_2$CH$_3$], and m is an integer of 1 to 40;

or combinations of at least two groups among the above general formulas (3), (4), (5), (6) and (7), for example, a combination of at least one group selected from the groups of the general formulas (3), (4), (5) and (6) with the group of the general formula (7).

Among these examples of Y, preferred are the groups represented by the general formulas (4), (6) and (7).

The two Z in the above general formula (1), which may be the same or different, are each a hydrogen atom, or a monovalent organic group having an acryloxy group or a methacryloxy group represented by the following general formula (2):

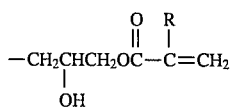

wherein R is a hydrogen atom or a methyl group. In the polyimide precursor (A), the content of the monovalent organic group represented by said general formula (2) is at least 30 mole %, preferably 30 to 80 mole %, of the total Z contained in the precursor. If the content of the monovalent organic group represented by the above general formula (2) is less than 30 mole %, a sufficient sensitivity can not be obtained when prepared the photosensitive composition.

The polyimide precursor (A) has a weight-average molecular weight of at least 10,000, more preferably at least 20,000, particularly 20,000 to 150,000.

The polyimide precursor (A) is prepared by, for example, reacting a tetracarboxylic acid dianhydride represented by the following general formula (8):

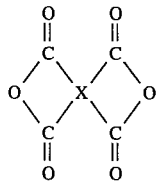

wherein X is as defined above, with a diamine compound represented by the general formula (9):

wherein Y and Z are as defined above, at usually 0° to 40° C. in a suitable solvent. However, methods for the preparation of the polyimide precursor (A) are not limited to the above method.

In the above method, the mole number of said tetracarboxylic acid dianhydride is substantially equal to that of said diamine compound.

Examples of said diamine compound are shown below: a compound represented by the general formula (10):

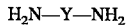

wherein Y is as defined above;
a compound represented by the general formula (11):

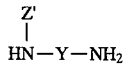

wherein Y is as defined above, and Z' is a monovalent organic group represented by the above general formula (2); and a compound represented by the general formula (12):

$$\overset{Z'}{\underset{HN-Y-NH}{|}}\overset{Z'}{\underset{|}{}} \quad (12)$$

wherein Y and Z' are as defined above; provided that the diamine compounds represented by the general formulas (10) to (12) should be used in combination such that the content of Z' are at least 30 mole % of the total Z (that is, the total of Z' and the hydrogen atoms bonded to the nitrogen atoms).

Any solvents can be used in the above method. Specific examples of the solvent include organic solvents, such as N-methyl-2-pyrrolidone, dimethylacetamide, dimethylformamide, hexamethylphospholylamide, tetrahydrofuran, 1,4-dioxane, methyl cellosolve, butyl cellosolve, diethylene glycol dimethyl ether, diethylene glycol diethyl ether, triethylene glycol dimethyl ether, acetone, methyl ethyl ketone, methyl isobutyl ketone, cyclopentanone, cyclohexanone, γ-butylolactone, butyl cellosolve acetate, toluene, xylene, anisole, methyl anisole and ethyl phenyl ether. These solvents may be used singly or in a combination of two or more thereof.

The tetracarboxylic acid dianhydrides represented by the above general formula (8) include, for example, pyromellitic acid dianhydride, benzophenone tetracarboxylic acid dianhydride, 3,3',4,4'-biphenyltetracaboxylic acid dianhydride, 2,2-bis[4-(3,4-dicarboxyphenoxy)phenyl]propanoic acid dianhydride, 2,2-bis(3,4-dicarboxyphenyl)perfluoropropanoic acid dianhydride, bis(3,4-dicarboxyphenyl)dimethylsilanoic acid dianhydride and 1,3-bis(3,4-dicarboxyphenyl)-1,1,3,3-tetramethyldisiloxanoic acid dianhydride. They may be used singly or in combination of two or more. Among the above tetracarboxylic acid dianhydrides, preferred are pyromellitic acid dianhydride, benzophenone tetracarboxylic acid dianhydride, 3,3',4,4'-biphenyltetracaboxylic acid dianhydride, 2,2-bis(3,4-dicarboxyphenyl)perfluoropropanoic acid dianhydride and 1,3-bis(3,4-dicarboxyphenyl)-1,1,3,3-tetramethyldisiloxanoic acid dianhydride.

The diamine compounds represented by the general formula (10) include, for example, aromatic diamine compounds such as p-phenylenediamine, m-phenylenediamine, 4,4'-diaminodiphenylmethane, 4,4'-diaminodiphenyl ether, 2,2'-bis(4-aminophenyl)propane, 4,4'-diaminodiphenyl sulfone, 4,4'-diaminodiphenyl sulfide, 1,4-bis(3-aminophenoxy)benzene, 1,4-bis(4-aminophenoxy)benzene, 1,4-bis(p-aminophenylsulfonyl)benzene, 1,4-bis(m-aminophenylsulfonyl)benzene, 1,4-bis(p-aminophenylthioether)benzene, 1,4-bis(m-aminophenylthioether)benzene, 2,2-bis[4-(4-aminophenoxy)phenyl]propane, 2,2-bis[3-methyl-4-(4-aminophenoxy)phenyl]propane, 2,2-bis[3-chloro-4-(4-aminophenoxy)phenyl]propane, 1,1-bis[4-(4-aminophenoxy)phenyl]ethane, 1,1-bis[3-methyl-4-(4-aminophenoxy)phenyl]ethane, 1,1-bis[3-chloro-4-(4-aminophenoxy)phenyl]ethane, 1,1-bis[3,5-dimethyl-4-(4-aminophenoxy)phenyl]ethane, bis[4-(4-aminophenoxy)phenyl]methane, bis[3-methyl-4-(4-aminophenoxy)phenyl]methane, bis[3-chloro-4-(4-aminophenoxy)phenyl]methane, bis[3,5-dimethyl-4-(4-aminophenoxy)phenyl]methane, bis[4-(4-aminophenoxy)phenyl]sulfone and 2,2-bis[4-(4-aminophenoxy)perfluoropropane; aromatic diamine compounds having an amide group represented by, for example, the following formulas:

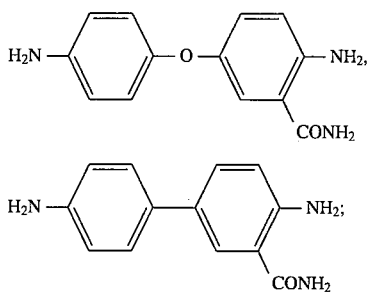

and diamino organosiloxane compounds represented by, for example, the following formulas:

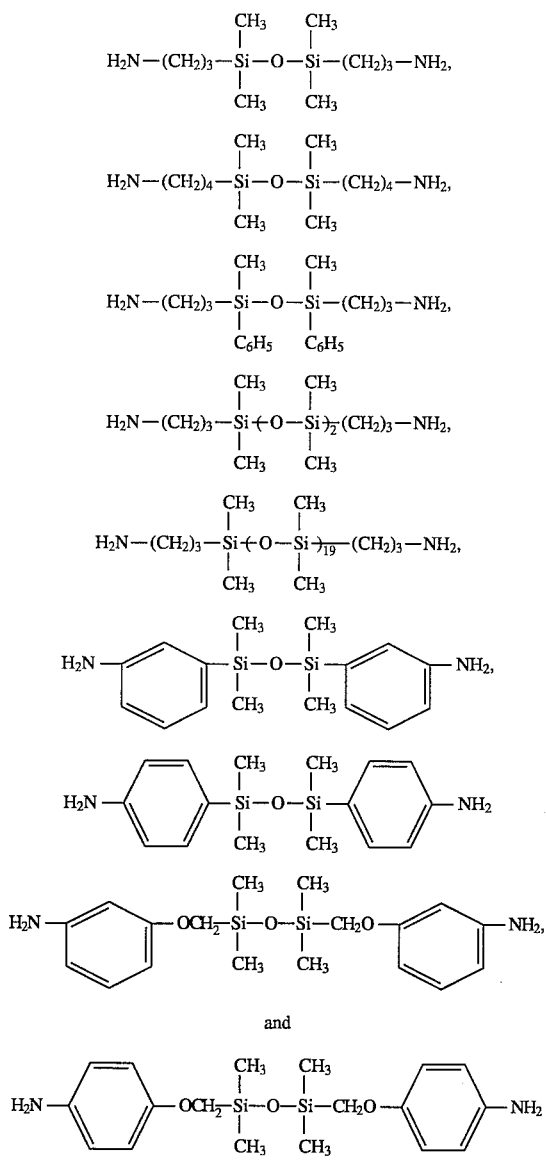

However, these examples are not to be construed as limiting the above diamine compounds. They may be used singly or in a combination of two or more thereof. Among the above diamine compounds represented by the above general formula (10), preferred are as follows:

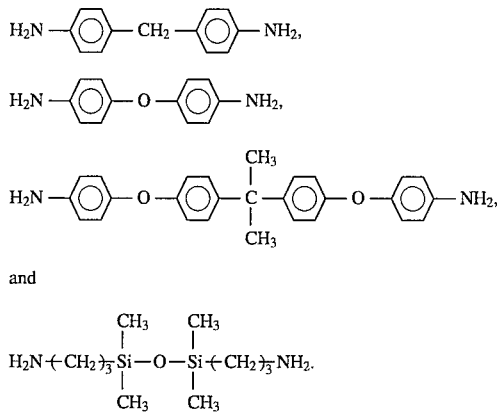

and

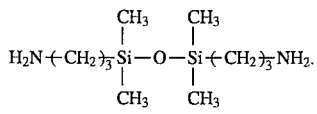

The diamine compounds having at least one group selected from an acryloxy group and a methoxyloxy group represented by the above general formulas (11) and (12) can be readily prepared by reacting the diamine compound represented by the above general formula (10) with at least one compound selected from glycidyl acrylate and glycidyl methacrylate usually at 60° to 120° C. In this case, examples (including preferable examples) of the diamine compound having the general formula (10) for use in the preparation of the diamine compounds represented by the general formulas (11) and (12) are as mentioned above. (B) Sensitizer, photopolymerization initiator or combination thereof The photosensitive composition of the present invention comprises, as an effective component, at least one member selected from the group consisting of a sensitizer and a photopolymerization initiator.

The sensitizers include, for example, benzophenone, acetophenone, anthrone, phenanthrene, nitrofluorene, nitroacenaphthene, 4,4'-bis(diethylamino)benzophenone, chlorothioxanthone, benzanthraquinone, 2,6-bis(4-diethylaminobenzal)cyclohexanone, 2,6-bis(4-diethylaminobenzal)-4-methylcyclohexanone, 4,4'-bis(diethylamino) chalcone, 2,4-diethylthioxanthone, N-phenyldiethanolamine, diethylaminoethyl methacrylate and coumalin compounds. However, these examples are not to be construed as limiting the sensitizers. They may be used singly or in a combination of two or more thereof. Among the above sensitizers, preferred are 2,6-bis(4-diethylaminobenzal)cyclohexanone, 2,4-diethylthioxanthone, diethylaminoethyl methacrylate and coumalin compounds.

The photopolymerization initiators include, for example, benzyl, benzoin isopropyl ether, 1-hydroxycyclohexylphenylketone, 2-methyl-[4-(methylthio)phenyl]-2-morpholino-1-propanone, 1-phenyl-1,2-butanedione-2-(o-methoxycarbonyl)oxime, N-phenylglycine, 3-phenyl-5-isooxazolone, biimidazole and camphorquinone. However, these examples are not to be construed as limiting the photopolymerization initiators. These photopolymerization initiators may be used singly or in a combination of two or more thereof. Among the above photopolymerization initiators, preferred are N-phenylglycine, 3-phenyl-5-isooxazolone and biimidazole.

Further, the sensitizer and the photopolymerization initiator may be used in combination.

Although any amount of the component (B), namely, at least one member selected from a sensitizer and a photopolymerization initiator, can be used, it is generally 0.1 to 20 weight %, preferably 0.5 to 10 weight %, based on the polyimide precursor of the component (A).

Photosensitive Resin Composition

The photosensitive resin composition is stored and used as a solution in which the polyimide precursor (A) and at least one member (B) selected from the group consisting of a sensitizer and a polymerization initiator have been dissolved in a suitable solvent.

The above solvent suitably used herein includes, for example, the organic solvents exemplified for the preparation of the polyimide precursor (A). These organic solvents can be used singly or in a combination of two or more thereof. The amount of the organic solvent used is preferably such an amount that the concentration of the above polyimide precursor (A) is 5 to 50 weight %.

A solution of the photosensitive resin composition of the present invention dissolved in an organic solvent is coated on a substrate, such as a silicon wafer, a metal plate, a glass plate or a ceramics plate, by means of known methods, such as spin-coating, dipping and printing; dried to form a coating film; and then subjected to processes comprising exposure to light, development with an aqueous alkaline solution and heat-curing, with respect to the coating film, whereby a patterned polyimide film excellent in characteristics such as heat resistance and the like is formed.

The formation of the coating film by drying can be effected, for example, by pre-baking the coating film at a temperature of 30° to 180° C. using a heating means such as dryer or hot plate for several minutes to several hours to remove most of the organic solvent contained in the coating film. The thickness of the dried coating film thus obtained is preferably about 5 to 40 μm.

The exposure is effected by laying a pattern-carrying mask on, and in contact with, the coating film formed in such a manner as mentioned above and then irradiating light, such as visible rays or ultraviolet rays, on the mask for several seconds to several minutes.

After the exposure, the unexposed areas of the coating film are dissolved and removed with a liquid developer to thereby obtain a resinous relief pattern. Since as the developer, an aqueous alkaline solution is used herein, there are no problems such as an affect on health and the treatment of waste liquids. Additionally, the time for development may be usually about 10 seconds to 3 minutes. Examples of the aqueous alkaline solution include aqueous solutions of alkali metal hydroxides, such as sodium hydroxide and potassium hydroxide; aqueous solutions of quaternary ammonium hydroxides, such as tetramethylammonium hydroxide and tetrabutylammonium hydroxide; aqueous solutions of organic amines, such as methyldiethanolamine and triethanolamine; and preferably an aqueous solution of tetramethylammonium hydroxide. The concentration of the aqueous alkaline solution is preferably 0.01 to 30 weight %.

Further, the resin of the relief pattern formed by the development as above is heated and cured at a temperature of usually 200° to 500° C., preferably 300° to 400° C., by a heating means such as dryer or electric furnace for several ten minutes to several hours, whereby a patterned polyimide film can be formed.

As mentioned above, since the photosensitive composition of the present invention can form readily a pattern and a polyimide resin film formed by curing said composition is excellent in heat resistance, mechanical properties and electrical properties, the photosensitive composition can be broadly used as a protective film for use in electronic parts. More specifically, it is suitably used, for example, as junction coating films on the surfaces of semiconductor elements such as diodes, transistors, I.C. and L.S.I.; passivation films; buffer coating films; α-rays shielding films in, for example, L.S.I.; insulating films between layers in multi-layered electrical wiring; and otherwise, conformal coatings in printed circuit boards; orientation films in liquid crystal display devices; and ion implantation masks.

EXAMPLES

The present invention will be specifically explained in the following with reference to working examples and a comparative example which are not to be construed as limiting the present invention.

PREPARATION OF THE SOLUTION (1) OF THE POLYIMIDE PRECURSOR

After the atmosphere within a flask equipped with a stirrer and a thermometer was replaced by nitrogen gas, 40.04 g of 4,4'-diaminodiphenyl ether, 45.44 g of glycidyl methacrylate and 355 g of N-methyl-2-pyrrolidone were charged into the flask and stirred while maintaining the temperature at 80° C. for 20 hours. The resulting reaction solution was cooled, and then the solution was analyzed by gel-permeation chromatography. As a result, it was found that the material glycidyl methacrylate disappears and an adduct of 1 mole of 4,4'-diaminodiphenyl ether to 1 mole of glycidyl methacrylate and an adduct of 1 mole of 4,4'-diaminodiphenyl ether to 2 moles of glycidyl methacrylate are produced.

Into the above reaction solution, 58.0 g of 3,3',4,4'-benzophenonetetracarboxylic acid dianhydride and 8.52 g of 1,3-bis(3,4-dicarboxyphenyl)-1,1,3,3-tetramethyldisiloxane dianhydride were added while cooling so that the temperature of the solution may not exceed 30° C. After the completion of the addition, the solution was stirred at room temperature for 10 hours.

Thus, there was obtained the solution (1) (viscosity at 25° C.:3,000 cP) of the polyimide precursor (A) having a structural unit represented by the following formula:

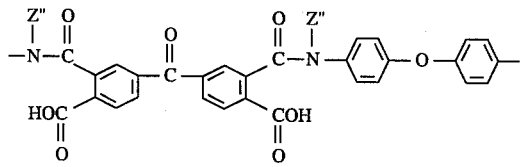

wherein Z" is a hydrogen atom or a methacryloxy-containing group represented by

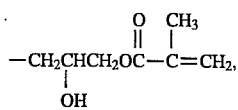

and a structural unit represented by the following formula:

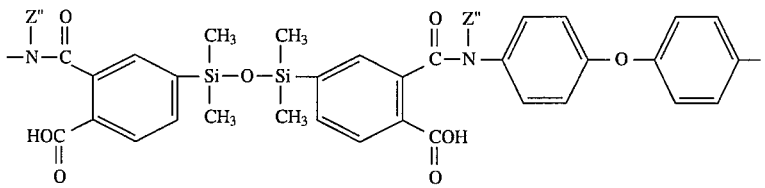

wherein Z" is as defined above, provided that the content of the methacryloxy-containing group is 80 mole % of the total Z". The polyimide precursor in the solution (1) had a weight-average molecular weight (GPC, in terms of polystyrene; hereinafter being the same) of 45,000.

PREPARATION OF THE SOLUTION (2) OF THE POLYIMIDE PRECURSOR

After the atmosphere within a flask equipped with a stirrer and a thermometer was replaced by nitrogen gas, 39.60 g of 4,4'-diaminodiphenyl methane, 17.04 g of glycidyl methacrylate and 300 g of N-methyl-2-pyrrolidone were charged into the flask and stirred while maintaining the temperature at 80° C. for 20 hours. The resulting reaction solution was cooled, and then the solution was analyzed by gel-permeation chromatography. As a result, it was found that the material glycidyl methacrylate is disappeared and an adduct of 1 mole of 4,4'-diaminodiphenyl methane to 1 mole of glycidyl methacrylate and an adduct of 1 mole of 4,4'-diaminodiphenyl methane to 2 moles of glycidyl methacrylate are produced.

Into the above reaction solution, 29.42 g of 3,3',4,4'-biphenyltetracarboxylic acid dianhydride and 42.60 g of 1,3-bis(3,4-dicarboxyphenyl)-1,1,3,3-tetramethyldisiloxane dianhydride were added while cooling so that the temperature of the solution may not exceed 30° C. After the completion of the addition, the solution was stirred at room temperature for 10 hours.

Thus, there was obtained the solution (2) (viscosity at 25° C.: 4,000 cP) of the polyimide precursor (A) having a structural unit represented by the following formula:

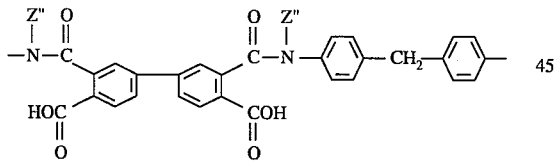

wherein Z" is as defined above, and a structural unit represented by the following formula:

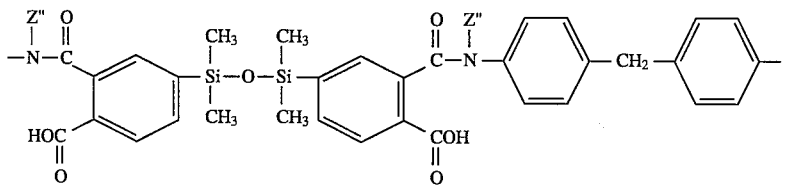

wherein Z" is as defined above, provided that the content of the methacryloxy-containing group is 30 mole % of the total Z". The polyimide precursor in the solution (2) had a weight-average molecular weight of 60,000.

PREPARATION OF THE SOLUTION (3) OF THE POLYIMIDE PRECURSOR

After the atmosphere within a flask equipped with a stirrer and a thermometer was replaced by nitrogen gas, 36.04 g of 4,4'-diaminodiphenyl ether, 34.08 g of glycidyl methacrylate and 380 g of N-methyl-2-pyrrolidone were charged into the flask and stirred while maintaining the temperature at 80° C. for 20 hours. The resulting reaction solution was cooled, and then the solution was analyzed by gel-permeation chromatography. As a result, it was found that the material glycidyl methacrylate disappears and an adduct of 1 mole of 4,4'-diaminodiphenyl ether to 1 mole of glycidyl methacrylate and an adduct of 1 mole of 4,4'-diaminodiphenyl ether to 2 moles of glycidyl methacrylate are produced.

Into the above reaction solution, 4.97 g of 1,3-bis[3-aminopropyl]-1,1,3,3-tetramethyldisiloxane and 88.84 g of 2,2-bis(3,4-dicarboxyphenyl)perfluoropropanoic acid dianhydride were added while cooling so that the temperature of the solution may not exceed 30° C. After the completion of the addition, the solution was stirred at room temperature for 10 hours.

Thus, there was obtained the solution (3) (viscosity at 25° C.: 2,300 cP) of the polyimide precursor (A) having a structural unit represented by the following formula:

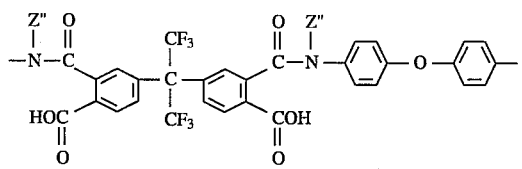

wherein Z" is as defined above, and a structural unit represented by the following formula:

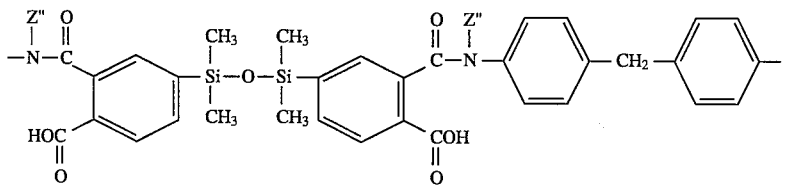

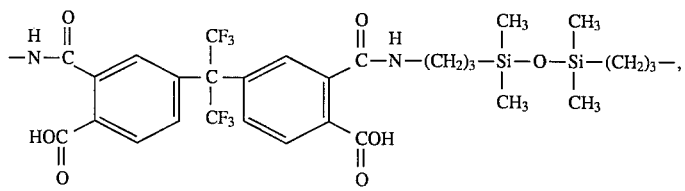

provided that the content of the methacryloxy-containing group is 60 mole % based on the total of Z" and the hydrogen atoms bonded to the nitrogen atoms. The polyimide precursor in the solution (3) had a weight-average molecular weight of 35,000.

EXAMPLES 1 TO 6

To 100 parts by weight of the solution (1), (2) or (3) of the polyimide precursor prepared as above, the component (B) was added in an amount shown in Table 1 to prepare six kinds of photosensitive resin compositions (Examples 1 to 6).

Thereafter, the solution of each of the above compositions was coated on a silicon wafer using a spin-coater, followed by drying the coated solution on a hot plate at 90° C. for 4 minutes to form a coating film. Then, a stripe-pattern-carrying photomask was layed on, and in close contact with, the resulting coating film, and ultraviolet rays from a 250 W extra-high pressure mercury lump was irradiated on the side of the photomask for 60 seconds. Then, development was effected with respect to each sample after the irradiation of ultraviolet rays using, as an alkaline solution, each of a 2.3% aqueous solution of tetramethylammonium hydroxide (TMAH) and a 0.5N KOH aqueous solution. The development was effected by dipping each sample in said alkaline solution for 1 minute. After the completion of the development, each sample was rinsed with pure water, and the form of each line-and-space pattern thus obtained was observed to measure a minimum width between lines (resolution). The results are shown in Table 1.

Further, each of the resulting samples was cured by heating at 150° C. for 0.5 hour and then at 350° C. for 1 hour in a dryer to evaluate the adhesion of the cured coating film to the silicon wafer according to a cross-cut adhesion test. The results are shown in Table 1.

The evaluation of the adhesion according to the cross-cut peeling test, which is effected by forming 100 squares in a cross-cut form at intervals of 1 mm on the cured coating film, adhering an adhesive tape to the cross-cut coating film and peeling off the tape therefrom, was given by the number of the squares remained when the adhesive tape was peeled off from the cross-cut coating film.

TABLE 1

| Examples | (A) Solution | (B) Sensitizer and/or photopolymerization initiator (parts by weight) | Developability/ TMAH | | Developability/ KOH | | Adhesion | |
|---|---|---|---|---|---|---|---|---|
| | | | Form of pattern | Resolution (μm) | Form of pattern | Resolution (μm) | Crosscut peeling test | Film thickness after cured (μm) |
| 1 | (1) | α (1.2) β (1.5) | Good | 40 | Good | 40 | 100/100 (number peeled off: 0) | 6.5 |
| 2 | (1) | γ (1.2) δ (0.3) | Good | 30 | Good | 30 | 100/100 | 7.0 |
| 3 | (2) | ε (0.2) η (1.2) | Good | 30 | Good | 30 | 100/100 | 7.5 |
| 4 | (2) | ζ (0.2) η (1.2) | Good | 30 | Good | 30 | 100/100 | 7.5 |
| 5 | (3) | δ (0.2) θ (1.2) | Good | 30 | Good | 30 | 100/100 | 7.0 |
| 6 | (3) | ζ (0.2) θ (1.2) | Good | 20 | Good | 20 | 100/100 | 7.5 |

α: camphorquinone
β: diethylaminoethyl methacrylate
γ: 2-methyl-[4-(methylthio)phenyl]-2-morpholino-1-propanone
δ: 2,4-diethylthioxanthone
ε: 2,6-bis(4-diethylaminobenzal)-4-methylcyclohexanone
ζ: carbonyl-bis(diethylaminocoumalin)
η: N-phenylglycine
θ: 3-phenyl-5-isoxazolone From the results shown in Table 1, it is understood that each of the resin compositions prepared in Examples 1 to 6 has a good sensitivity even when formed into a relatively thick film from the solution of each composition, that the film can be developed with an aqueous alkaline solution, and that the film after developed has a good pattern and is also excellent in adhesion to silicon wafers so that the patterned film can be suitably used as a protective film for use in electronic parts.

COMPARATIVE EXAMPLE 1

A solution (4) of a comparative polyimide precursor was prepared in the same manner as set forth in the preparation of the solution (1) of the polyamide precursor (A), except that 40.04 g of 4,4'-diaminodiphenyl ether, 11.36 g of glycidyl methacrylate, 355 g of N-methyl-2-pyrrolidone and 58.0 g of 3,3',4,4'-benzophenonetetracarboxylic acid dianhydride and 8.52 g of 1,3-bis(3,4-dicarboxyphenyl)-1,1,3,3-tetramethyldisiloxane dianhydride were used to prepare the solution (4) (viscosity at 25° C.:3,800 cP) of the comparative polyimide precursor in which the content of the methacryloxy-containing group is 20 mole % of the total Z". The comparative polyimide precursor in the solution (4) had a weight-average molecular weight of 50,000.

Thereafter, a comparative composition was prepared in accordance with the same method as in the preparation method of the photosensitive composition of Example 1 in which 1.2 parts by weight of camphorquinone represented by α and 1.5 parts by weight of diethylaminoethyl methacrylate represented by β as shown in Table 1 were used, except that the above solution (4) of the comparative polyimide precursor was used in place of the solution (1) of the polyimide precursor (A). The same formation of pattern as in Examples 1 to 6 was tried using the resulting comparative composition, but after the exposure, the unexposed areas were dissolved together with the exposed areas in the liquid developer during the development, whereby a sufficient sensitivity could not be obtained.

I claim:

1. A photosensitive resin composition comprising:
   (A) a polyimide precursor comprised of a structural unit represented by the following general formula (1):

$$\begin{array}{c} Z\ O\quad\quad O\ Z \\ |\ \,\|\quad\quad\|\ \,| \\ -N-C\quad\quad C-N-Y- \\ \diagdown\diagup \\ X \\ \diagup\diagdown \\ HOC\quad\quad COH \\ \|\quad\quad\quad\| \\ O\quad\quad\quad O \end{array} \quad (1)$$

wherein X is a tetravalent organic group having an aromatic ring, Y is a divalent organic group having an aromatic ring or a divalent organic group having a siloxane bond, and the two Z are each a hydrogen atom or a monovalent organic group having an acryloxy group or a methacryloxy group represented by the following general formula (2):

$$\begin{array}{c} O\ \ R \\ \|\ \ | \\ -CH_2CHCH_2OC-C=CH_2 \\ | \\ OH \end{array} \quad (2)$$

wherein R is a hydrogen atom or a methyl group, provided that the content of the monovalent organic group represented by said general formula (2) is at least 30 mole % of the total z contained in the polyimide precursor; and
   (B) a member selected from the group consisting of a sensitizer, a photopolymerization initiator and a combination thereof.

2. The composition of claim 1, wherein X in the general formula (1) is selected from the groups represented by the following formulas:

[structures shown]

-continued

[structures shown]

and

[structure shown]

3. The composition of claim 1, wherein Y in the general formula (1) is selected from the group consisting of:

[structure (3)]

wherein $R^1$ is —H, —Cl, —CONH$_2$ or an alkyl group having 1 to 3 carbon atoms;

[structure (4)]

wherein $R^1$ is single bond, —O—, —SO$_2$—, —S— or an alkylene group having 1 to 3 carbon atoms, and the plural $R^2$ are as defined in formula (3);

[structure (5)]

wherein the plural $R^1$ are as defined in formula (4), and the plural $R^2$ are as defined in formula (3);

[structure (6)]

wherein $R^1$ is as defined in formula (4), and the plural $R^2$ are as defined in formula (3);

$$-R^3\!\!-\!\!\left(\!\!\begin{array}{c} R^4 \\ | \\ Si-O \\ | \\ R^4 \end{array}\!\!\right)_{\!m}\!\!\begin{array}{c} R^4 \\ | \\ Si-R^3- \\ | \\ R^4 \end{array} \quad (7)$$

wherein the plural $R^3$ are each an alkylene group having 3 to 4 carbon atoms, a phenylene group or

[structure —CH$_2$O—phenyl]

the plural $R^4$ are each an alkyl group having 1 to 3 carbon atoms, and m is an integer of 1 to 40.

4. The composition of claim 1, wherein the polyimide precursor (A) has a weight-average molecular weight of 10,000 to 150,000.

5. The composition of claim 1, wherein the polyimide precursor (A) comprises a reaction product of a teracarboxylic acid dianhydride represented by the following general formula (8):

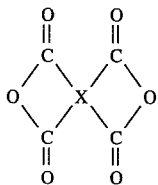 (8)

with a diamine compound represented by the general formula (9):

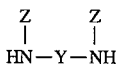 (9)

6. The composition of claim 1, wherein the amount of the component (B) is 0.1 to 20 weight % based on the component (A).

7. A process for forming a patterned polyimide film, which comprises the steps of:

coating a solution of the photosensitive resin composition as defined in claim 1 on a substrate and drying the same to form a coating film, exposing the coating film to light and developing the same using, as a liquid developer, an aqueous alkaline solution to form a patterned film, and heat-curing the patterned film.

8. The process of claim 7, wherein the drying temperature of the coating film is 30° to 180° C. and the heat-curing temperature of the patterned film is 200° to 500° C.

9. The process of claim 7, wherein the thickness of the coating film after drying is 5 to 40 μm.

10. The process of claim 7, wherein the aqueous alkaline solution is an aqueous solution of tetramethylammonium hydroxide.

11. The process of claim 7, wherein said aqueous alkaline solution contains, as a solute, a compound selected from the group consisting of alkali metal hydroxides, quaternary ammonium hydroxides and organic amines, and the concentration of the solute is 0.01 to 30 by weight.

* * * * *